(12) United States Patent
McGahay et al.

(10) Patent No.: US 11,127,678 B2
(45) Date of Patent: Sep. 21, 2021

(54) DUAL DIELECTRIC LAYER FOR CLOSING SEAM IN AIR GAP STRUCTURE

(71) Applicant: GLOBALFOUNDRIES U.S. Inc., Santa Clara, CA (US)

(72) Inventors: Vincent J. McGahay, Poughkeepsie, NY (US); Craig R. Gruszecki, Poughquag, NY (US); Ju Jin An, Fishkill, NY (US); Tim H. Lee, Fishkill, NY (US); Todd J. Van Kleeck, Kerhonkson, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 56 days.

(21) Appl. No.: 16/708,866

(22) Filed: Dec. 10, 2019

(65) Prior Publication Data
US 2021/0175166 A1      Jun. 10, 2021

(51) Int. Cl.
| H01L 23/528 | (2006.01) |
| H01L 29/06 | (2006.01) |
| H01L 23/522 | (2006.01) |
| H01L 21/768 | (2006.01) |

(52) U.S. Cl.
CPC ........ *H01L 23/528* (2013.01); *H01L 21/7682* (2013.01); *H01L 23/5222* (2013.01); *H01L 29/0649* (2013.01)

(58) Field of Classification Search
CPC ............... H01L 23/528; H01L 29/0649; H01L 23/5222; H01L 21/7682; H01L 21/0337; H01L 21/764; H01L 21/76831; H01L 21/823; H01L 29/423; H01L 29/045; H01L 29/66666; H01L 29/0847; H01L 23/4824; H01L 23/535; H01L 23/53295; H01L 29/41758; H01L 29/4238; H01L 29/66568; H01L 29/78; H01L 21/0214; H01L 21/02274; H01L 21/02164; H01L 21/3145; H01L 21/02362; H01L 21/76801; H01L 21/02211; H01L 21/76807; H01L 29/78654; H01L 21/32139; H01L 27/1248; C23C 16/308
USPC ................ 257/401, 288, 522, 741, E21.267, 257/E21.269, E21.573, E21.581, E23.002; 438/197, 763, 618, 637, 127, 586
See application file for complete search history.

(56) References Cited

U.S. PATENT DOCUMENTS

| 5,641,712 A | 6/1997 | Grivna et al. |
| 7,790,601 B1 | 9/2010 | Choi et al. |
| 9,653,348 B1 * | 5/2017 | Wu .................. H01L 23/53295 |
| 9,659,865 B2 | 5/2017 | Saka et al. |
| 10,157,777 B2 | 12/2018 | He et al. |

(Continued)

*Primary Examiner* — Mouloucoulaye Inoussa
(74) *Attorney, Agent, or Firm* — Hoffman Warnick LLC

(57) ABSTRACT

A structure includes an air gap structure including: an opening in a first dielectric layer between adjacent conductors, and a non-conformal dielectric layer over the opening. In some cases, the non-conformal dielectric layer narrows an end portion of the opening of the air gap but may not seal the opening. In other cases, the non-conformal layer may seal the end portion of the opening and include a seam therein. The air gap structure may also include a conformal dielectric layer on the non-conformal dielectric layer. The conformal layer either seals the end portion of the opening or, if present, seals the seam. The structure may also include a wiring layer over the air gap structure.

15 Claims, 6 Drawing Sheets

(56) References Cited

U.S. PATENT DOCUMENTS

| | | | | |
|---|---|---|---|---|
| 2008/0308898 A1* | 12/2008 | Gabric | ............ | C23C 16/308 |
| | | | | 257/522 |
| 2012/0037962 A1* | 2/2012 | Breyta | ............ | H01L 23/4821 |
| | | | | 257/288 |
| 2015/0243544 A1* | 8/2015 | Alptekin | ............ | H01L 29/6653 |
| | | | | 438/586 |
| 2016/0133508 A1* | 5/2016 | Gates | ............ | H01L 23/53266 |
| | | | | 438/654 |
| 2016/0163816 A1* | 6/2016 | Yu | ............ | H01L 29/785 |
| | | | | 438/283 |
| 2017/0330832 A1* | 11/2017 | He | ............ | H01L 21/7682 |
| 2019/0096742 A1* | 3/2019 | Tsai | ............ | H01L 21/76895 |
| 2019/0206718 A1 | 7/2019 | LiCausi et al. | | |
| 2020/0020568 A1* | 1/2020 | Lin | ............ | H01L 21/76834 |
| 2020/0105928 A1* | 4/2020 | Lee | ............ | H01L 29/0649 |
| 2020/0152736 A1* | 5/2020 | Yu | ............ | H01L 27/0886 |

* cited by examiner

DUAL DIELECTRIC LAYER FOR CLOSING SEAM IN AIR GAP STRUCTURE

BACKGROUND

The present disclosure relates to integrated circuit (IC) fabrication, and more specifically, to a structure including an air gap structure and wiring layer, and a related method. The structure and method use a dual dielectric layer including a conformal dielectric layer over a non-conformal dielectric layer over an opening to seal any seam in the non-conformal dielectric layer.

Air gap structures are provided in a wide variety of IC systems to improve performance. For example, radio frequency (RF) switches are widely used in telecommunications equipment such as smartphones to route high frequency telecommunications signals through transmission paths. For instance, RF switches are commonly used in smartphones to allow use with different digital wireless technology standards used in different geographies. Current RF switches are generally fabricated using semiconductor-on-insulator (SOI) substrates. SOI substrates typically use a layered silicon-insulator-silicon substrate in place of a more conventional silicon substrate (bulk substrate). SOI-based devices differ from conventional silicon-built devices in that the silicon junction is above an electrical insulator, typically silicon dioxide or (less commonly) sapphire. One challenge with RF switches formed in SOI substrates is controlling two competing parameters: on-resistance ($R_{on}$) which is the resistance of the switch when power is switched on, and off-state capacitance ($C_{off}$) which indicates the amount of cross-talk or noise that may occur within the system, i.e., the amount transmitted signals on one circuit creates an undesired effect on another circuit. $R_{on}$ is preferred to be as low as possible when the RF switch is on to reduce the power consumption, and $C_{off}$ should be minimized to reduce undesired coupling noise.

In order to improve performance, air gap structures are formed between wires to lower $C_{off}$ in RF switch systems. Typically, air gap structures are formed by creating an open space and then sealing the open space by deposition of a dielectric layer, e.g., TEOS (tetraethyl orthosilicate, $Si(OC_2H_5)_4$)-based or silane ($SiH_4$)-based silicon dioxide ($SiO_2$). TEOS-based silicon dioxide is conformal and fills too much of the air gap, reducing the performance improvement. Silane-based silicon dioxide is non-conformal and creates air gaps with good size, but results in a weakness above the air gap. The weakness is typically in the form of a large seam, e.g., 170-270 nanometers (nm) long vertically in an illustrative implementation, where the dielectric closes against itself. The seam can be breached by moisture, e.g., from subsequent wet etches, that enters the air gap and blisters the layers above the seam, causing defects. One approach to address the issue narrows the gap using spacers, but this reduces the width of the airgap and thus limits any performance improvement. Another approach uses a thicker dielectric layer to seal the opening and taller contacts, but this process distances wiring layers over the airgap and may require different sized contacts across the chip.

SUMMARY

A first aspect of the disclosure is directed to a structure, comprising: an air gap structure including: an opening in a first dielectric layer between adjacent conductors, a non-conformal dielectric layer over the opening, the non-conformal dielectric layer closing an end portion of the opening, a seam in the non-conformal dielectric layer over the end portion of the opening; a conformal dielectric layer over the non-conformal dielectric layer, the conformal dielectric layer structured to seal the seam in the non-conformal dielectric layer and being devoid of wiring; and a wiring layer over the air gap structure.

A second aspect of the disclosure includes a structure, comprising: an air gap structure including: an opening in a first dielectric layer between adjacent conductors, a non-conformal dielectric layer over the opening, the non-conformal dielectric layer narrowing an end portion of the opening of the air gap but not sealing the opening, and a conformal dielectric layer on the non-conformal dielectric layer, the conformal dielectric layer structured to seal the end portion of the opening; and a wiring layer over the air gap structure.

A third aspect of the disclosure relates to a method, comprising: forming an air gap structure, including: forming an opening in a first dielectric layer between adjacent conductors; forming a non-conformal dielectric layer over the opening to one of: stop before sealing the opening to leave an end portion of the opening open, and close the end portion of the opening, creating a seam in the non-conformal dielectric layer over the end portion of the opening; forming a conformal dielectric layer on the non-conformal dielectric layer to one of: where the end portion remains open, seal the end portion of the opening to form the air gap structure, and wherein the seam is created in the non-conformal dielectric layer, seal the seam in the non-conformal dielectric layer to form the air gap structure, wherein the conformal dielectric layer is devoid of wiring; and forming a wiring layer over the air gap structure.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

The present disclosure relates to a structure including an air gap structure and a wiring layer. The air gap structure may include: an opening in a first dielectric layer between adjacent conductors, and a non-conformal dielectric layer over the opening. In some cases, the non-conformal dielectric layer narrows an end portion of the opening of the air gap but may not seal the opening. In other cases, the non-conformal layer may seal the end portion of the opening and include a seam therein. The air gap structure may also include a conformal dielectric layer on the non-conformal dielectric layer. The conformal layer either seals the end portion of the opening or, if present, seals the seam. A method of forming the structure is also provided. The air gap reduces the capacitance between a transistor gate and adjacent wires, contacts, and vias used to, for example, contact the source and drain of the transistor. The dual dielectric layers may close an end portion of the opening of the air gap, and may additionally seal a seam in one of the dielectric layers. The dual dielectric layers closing the opening and/or seam prevents defects caused by moisture that may enter the air gap during subsequent processing, e.g., wet etches.

Figure 1:
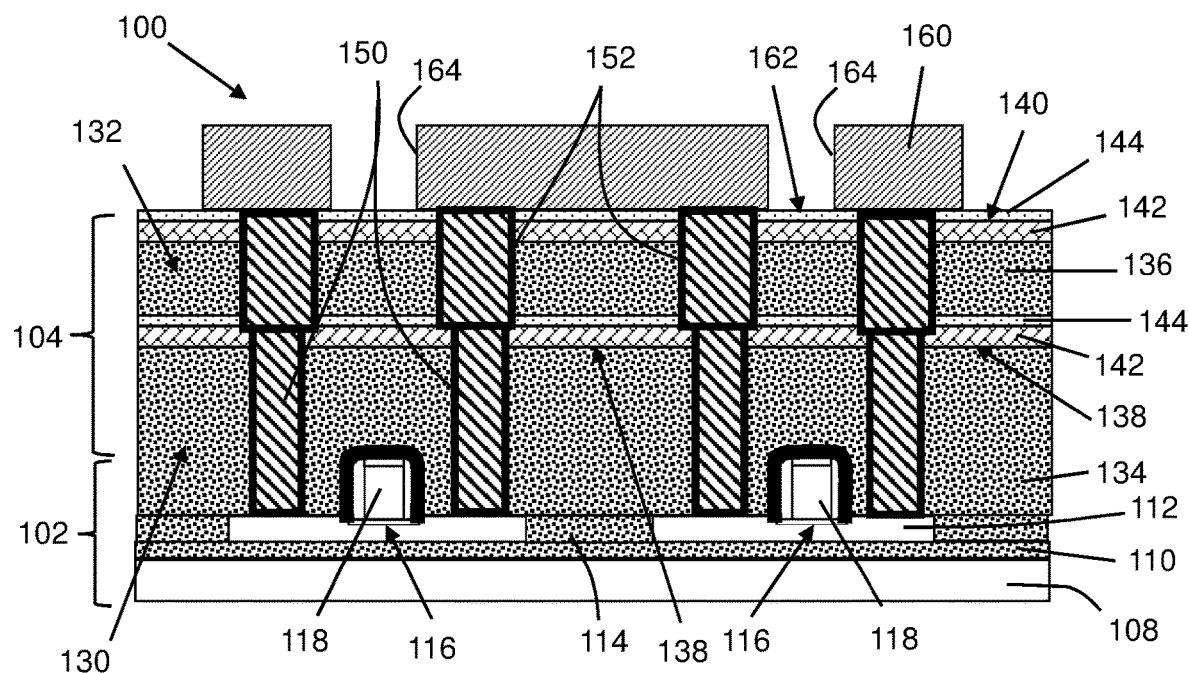
FIG. 1 shows a cross-sectional view of an initial structure for a method according to embodiments of the disclosure.
Figure 7A:
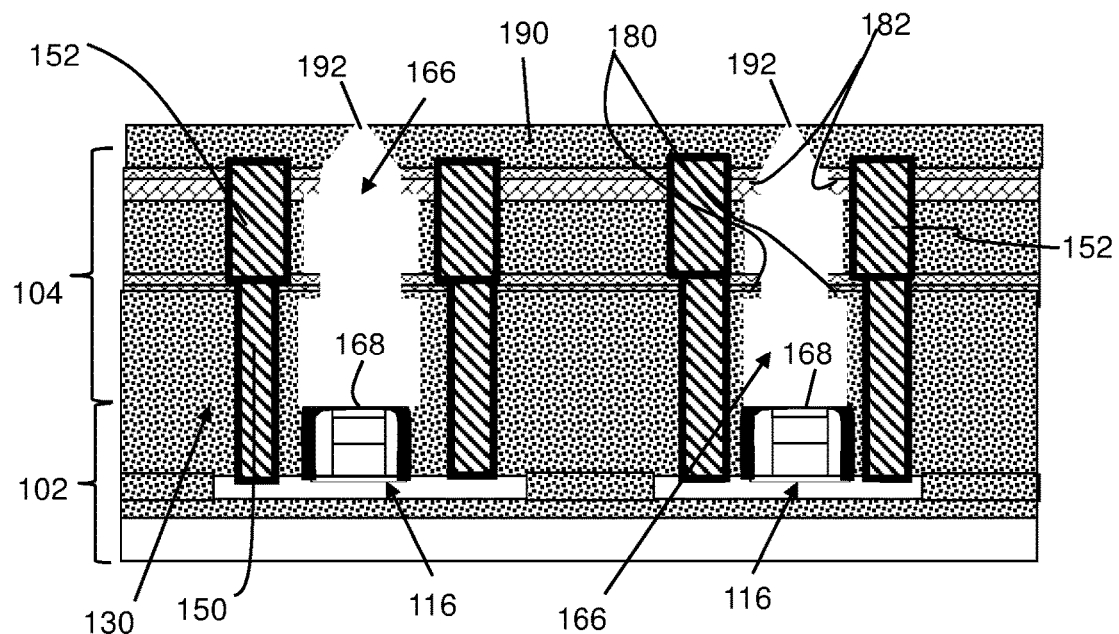
FIGS. 7A and 7B show cross-sectional views of forming a non-conformal dielectric layer of a dual dielectric layer according to embodiments of the disclosure.

Referring to FIG. 1, a cross-sectional view of an initial structure for a method of forming a structure 230 (FIGS. 9A-9B) according to embodiments of the disclosure, is illustrated. FIGS. 1-8B show forming an air gap structure 188 (see e.g., FIGS. 7B and 8B), and FIGS. 9A-B show forming a wiring layer 210. FIG. 1 shows a semiconductor device 100 after formation of a device layer 102 and a dielectric layer 104. Dielectric layer 104 is a first dielectric layer that functions as an interconnect layer. Device layer 102 is illustrated as including a semiconductor-on-insulator (SOI) substrate 106 including a semiconductor substrate 108 with an insulator layer 110 thereover and a semiconductor-on-insulator (SOI) layer 112 thereover. Substrate 108 and SOI layer 112 may include but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable materials include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate 108 and/or SOI layer 112 may be strained. For example, SOI layer 112 may be strained. SOI layer 112 may be segmented by shallow trench isolations (STI) 114. Insulator layer 110 may include any appropriate dielectric material for the application desired, e.g., silicon dioxide ($SiO_2$) or (less commonly) sapphire. Insulator layer 110 and/or STI 114 may also include the same material, such as silicon dioxide or any other interlayer dielectric material described herein. While the teachings of the disclosure will be described with regard to an SOI substrate and relative to an RF switch, it will be understood that the embodiments can be applied to various alternative semiconductor devices such as but not limited to low noise amplifiers (LNA) and power amplifiers. Further, the teachings may be applied to different substrates, such as a bulk substrate, nanosheet, nanowires, etc.

Figure 2:
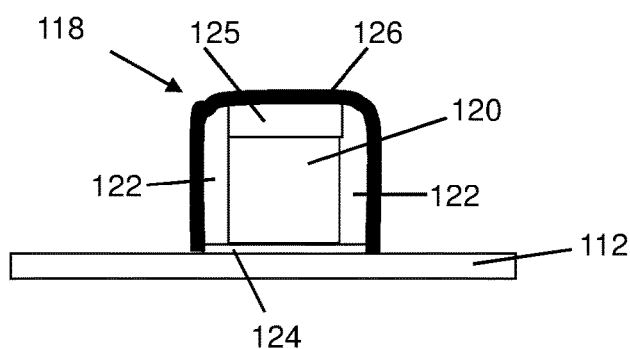
FIG. 2 shows an enlarged cross-sectional view of an illustrative transistor gate.

Device layer 102 also includes a number of transistors 116 formed therein. Each transistor 116 may include any now known or later developed transistor structure such as doped source/drain regions (not labeled) in SOI layer 112 having a transistor gate 118 thereover and therebetween. FIG. 2 shows an enlarged cross-sectional view of an illustrative transistor gate 118. Each transistor gate 118 may include, among other structures, a body 120 of polysilicon or a metal gate conductor (commonly referred to collectively as "PC"), spacers 122 about body 120, a gate dielectric 124 under body 120, a silicide layer 125 over body 120 (i.e., a silicon-metal alloy), and an etch stop layer 126 over silicide layer 125 and/or spacers 122. Spacers 122 may include any now known or later developed spacer material such as silicon nitride ($Si_3N_4$), and gate dielectric 124 may include any now known or later developed gate dielectric material such as: hafnium silicate (HfSiO), hafnium oxide ($HfO_2$), zirconium silicate ($ZrSiO_x$), zirconium oxide ($ZrO_2$), silicon oxide ($SiO_2$), silicon nitride ($Si_3N_4$), silicon oxynitride (SiON), high-k material or any combination of these materials. Etch stop layer 126 may include any now known or later developed etch stop material such as silicon nitride. Silicide layer 125 may include any now known or later developed silicide material, e.g., titanium, nickel, cobalt, etc. As understood, each transistor gate 118 may run into, out of, or across the page as illustrated. While transistor 116 has been illustrated as a planar transistor, the teachings of the disclosure are applicable to any variety of transistor such as but not limited to: finFETs, nanosheet FETs, nanowire FETs, etc.

Returning to FIG. 1, dielectric layer 104, as described herein, may include a number of layers including a contact or local interconnect layer 130 (commonly referred to as a contact area (CA) layer) and a first metal layer 132. Each layer 130, 132 may include an interlayer dielectric (ILD) 134, 136, respectively. ILDs 134, 136 may include may but are not limited to: silicon nitride ($Si_3N_4$), silicon dioxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. Each layer 130, 132 may also include a respective cap layer 138, 140 at an upper surface thereof. Each cap layer 138, 140 may include one or more layers, for example, a silicon dioxide layer 142 and an etch stop layer 144, formed from silicon nitride (nitride), silicon carbo nitride (SiCN), etc., as known in the art. As understood, various other forms of cap layers may also be employed. Further, it is emphasized that while cap layers 138, 140 are illustrated as identical, they can be different materials, thicknesses, etc.

A number of contacts 150 may extend through ILD 134 of contact or local interconnect layer 130 (hereafter "local interconnect layer 130") to various parts of device layer 102. In the example shown, contacts 150 extend to source/drain regions of transistors 116. As understood, each contact 150 may include a conductor such as aluminum or copper, within a refractory metal liner of ruthenium; however, other refractory metals such as tantalum (Ta), titanium (Ti), tungsten (W), iridium (Jr), rhodium (Rh) and platinum (Pt), etc., or mixtures of thereof, may also be employed. Typically, contacts 150 extend mostly vertically within semiconductor device 100 to connect conductors in layers thereof, i.e., vertically on page as illustrated. First metal layer 132 may include a number of metal wires 152 therein. Each metal wire 152 may use the same materials as listed for contacts 150. In contrast to contacts 150, metal wires 152 extend mostly horizontally or laterally in a layer within semiconductor device 100 to connect contacts 150 therein, i.e., into, out of, or across a page as illustrated. In this manner, first metal layer 132 may include a metal wire 152 extending laterally parallel to transistor gate 118 in device layer 102, i.e., vertically above but parallel to transistor gate 118. Semiconductor device 100 as illustrated in FIG. 1 can be formed using any now known or later developed semiconductor fabrication techniques, e.g., material deposition, photolithographic patterning and etching, doping, etc. Although contacts 150 and wires 152 are shown in FIG. 1 as single damascene levels, they could be formed using as dual damascene levels containing refractory metal lined copper or tungsten, as known in the art.

"Depositing" or "deposition," as used herein, may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 3:
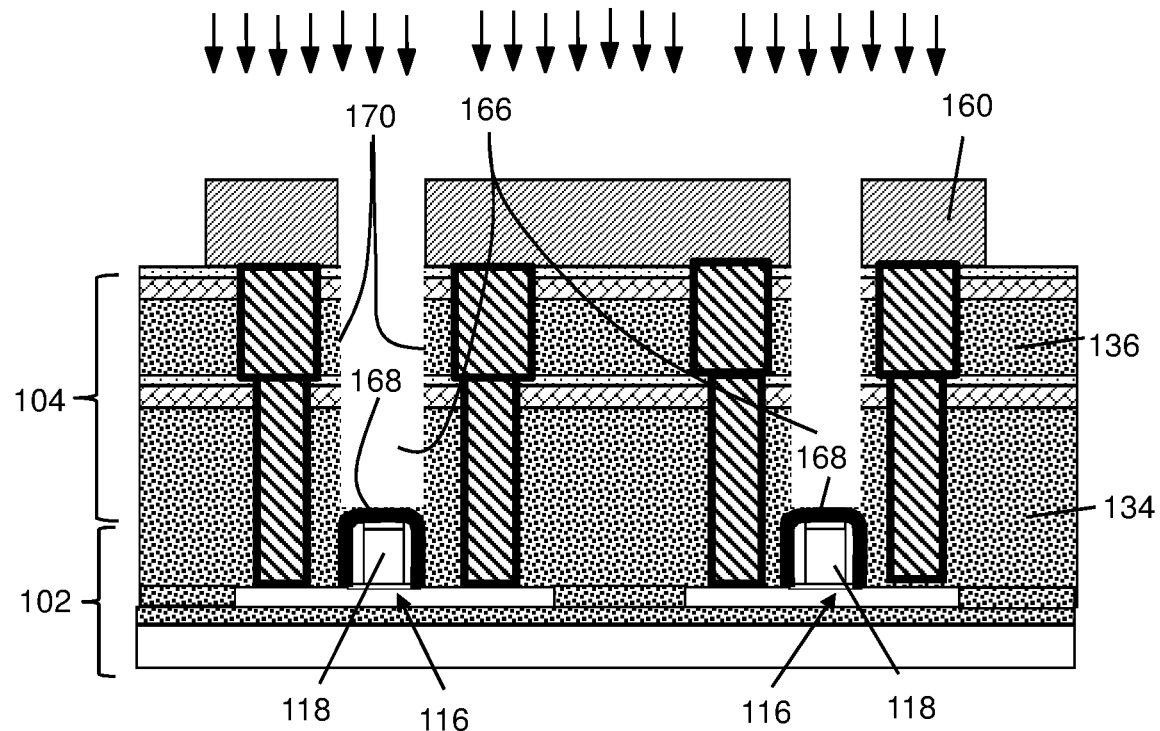
FIG. 3 shows a cross-sectional view of etching an opening according to embodiments of the disclosure.

FIGS. 1 and 3 also show forming an opening 166 in dielectric layer 104 between adjacent conductors, e.g., contacts 150 and/or metal wires 152. Opening 166 may be formed in a number of ways. FIG. 1 shows forming an air gap mask 160 exposing a portion 162 of dielectric layer 104 over device layer 102. Mask 160 may be formed, for example, post first metal layer 132 damascene planarization, e.g., via chemical mechanical polishing (CMP), and may include any now known or later developed masking material. Mask 160 is patterned and etched in a conventional fashion to create openings 164 therein.

FIG. 3 shows a cross-sectional view of etching opening 166 through dielectric layer 104 using air gap mask 160 above transistor gate 118. Opening 166 exposes sidewalls 170 of dielectric layer 104, e.g., ILDs 134, 136 of dielectric layer 104. Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch, and (ii) dry etch. Wet etch is performed with a solvent (such as an acid or a base) which may be chosen for its ability to selectively dissolve a given material (such as oxide), while leaving another material (such as polysilicon or nitride) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches. In FIG. 3, the etching may include a RIE. Opening 166 may extend above transistor gate 118 to a depth that can be user selected, e.g., based on etching duration or chemistry. With regard to opening 166 depth, etching opening 166 may cease when opening 166: meets or extends to etch stop layer 126 (as shown); recesses etch stop layer 126; removes (extends beyond) etch stop layer 126 exposing silicide layer 125; exposes body 120, e.g., if silicide layer 125 is not present or has been removed entirely; or does not expose etch stop layer 126 by not extending through ILD 134 above gate 118. Accordingly, the etching of FIG. 3 can be controlled to select the extent of exposure of an upper surface 168 of transistor gate 118.

Figure 4:
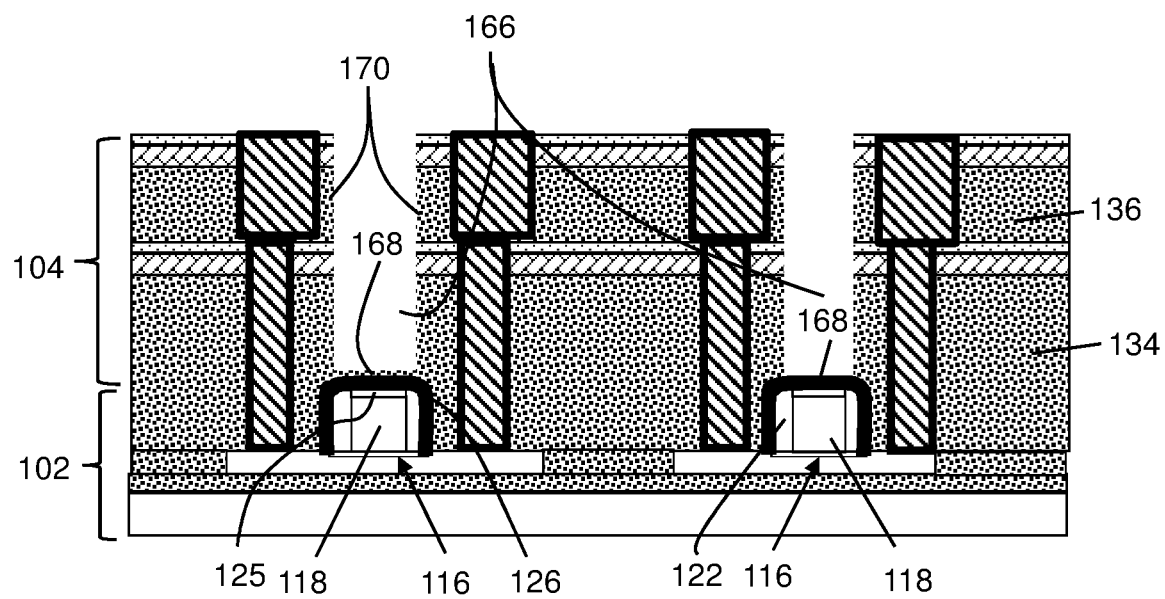
FIG. 4 shows a cross-sectional view of removing an air gap mask according to embodiments of the disclosure.

FIG. 4 shows a cross-sectional view of the structure after removing air gap mask 160 (FIG. 3). Air gap mask 160 (FIG. 3) may be removed using any now known or later developed resist strip, in-situ or ex-situ. As understood in the art, openings 166 can take a variety of lateral forms. For example, openings 166 may be laterally elongate openings (into and out of page) above transistor gate 118. That is, rather than simple vertical openings, openings 166 have a length, e.g., just short of a transistor gate 118 that they parallel. Alternatively, a portion of opening 166 may be etched in a laterally disposed T-shape, i.e., in a T-shape laid out horizontally in the plane of the page; or openings 166 may be designed such that they are narrower adjacent to contacts 150 to reduce the likelihood of contact 150 intersects air gap structure 188; or openings 166 may be etched as many, not necessarily elongated, disconnected openings. Air gap openings 166 may also be formed with different widths. For example, air gap opening 166 width may be reduced, for example, near contacts 150 or later formed vias to reduce the likelihood of the air gap structure 188 intersecting the contacts or vias, due to misalignment.

Figure 5:
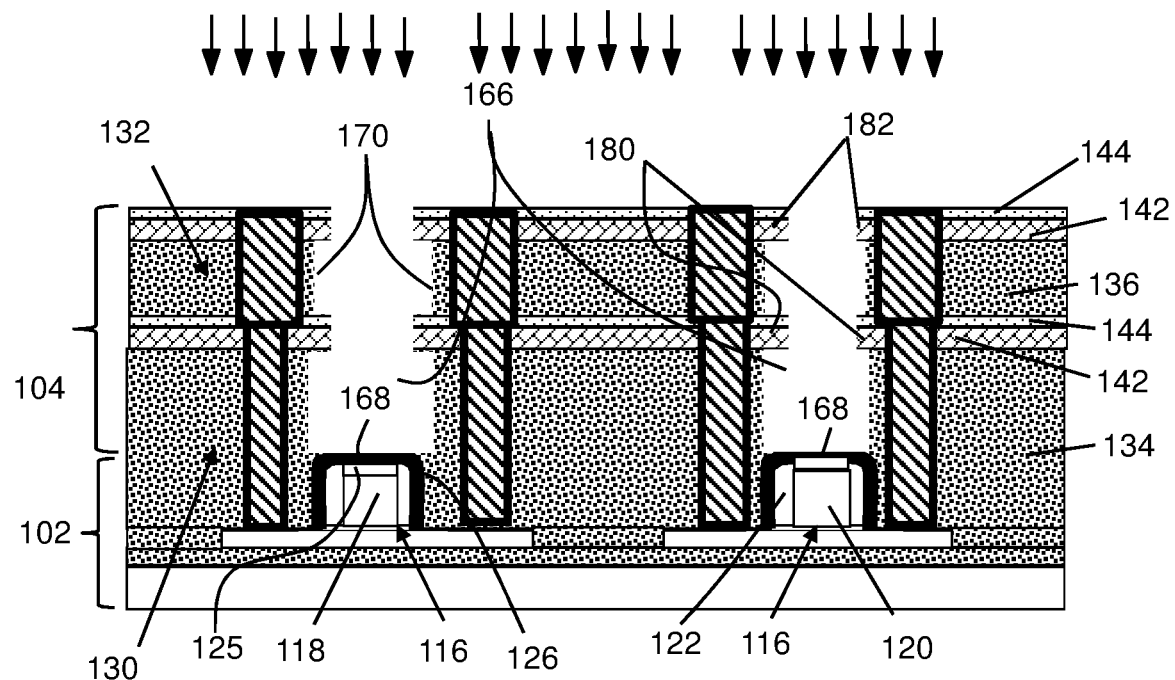
FIG. 5 shows a cross-sectional view of optionally recessing an opening according to embodiments of the disclosure.
Figure 6:
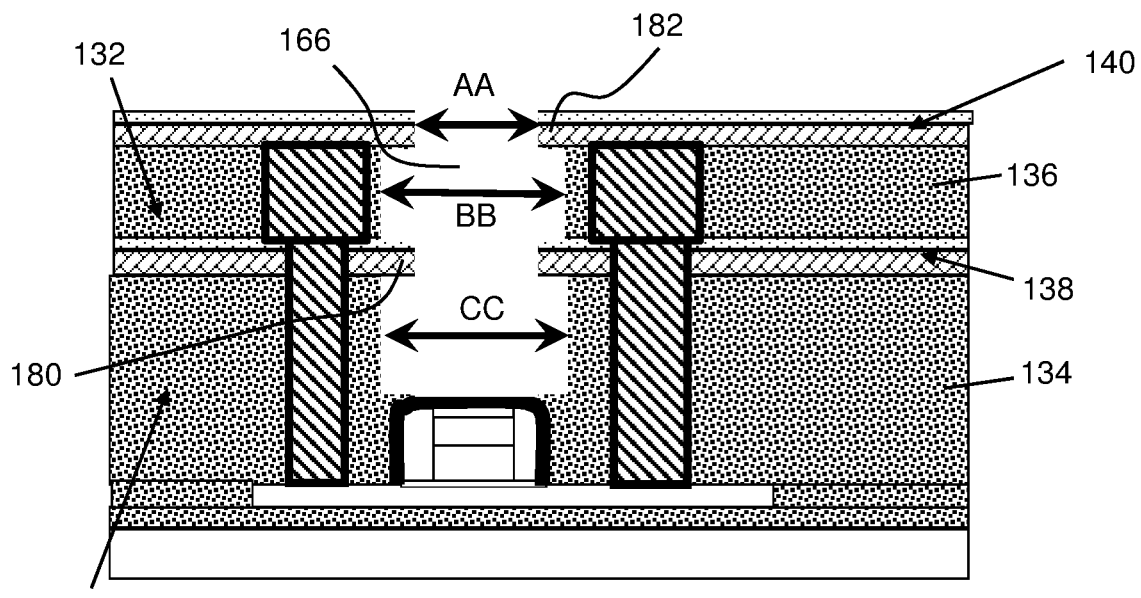
FIG. 6 shows an enlarged cross-sectional view of a detail of the FIG. 5 embodiment.
Figure 7B:
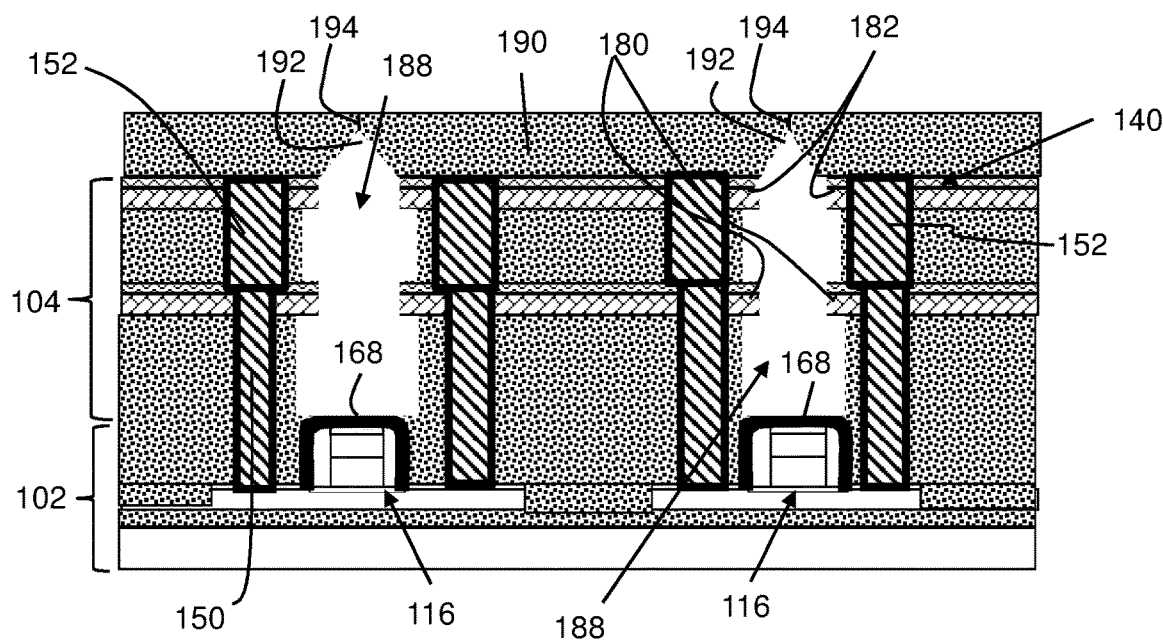
Figure 8A:
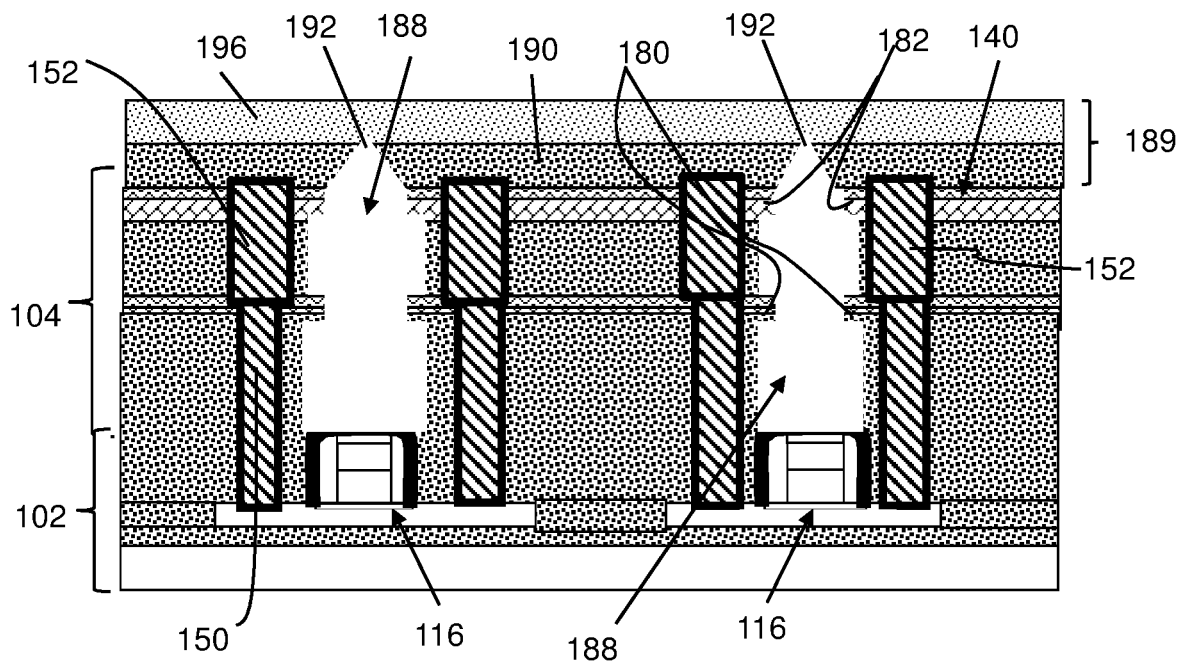
FIGS. 8A and 8B show cross-sectional views of forming a conformal dielectric layer of a dual dielectric layer according to embodiments of the disclosure.
Figure 8B:
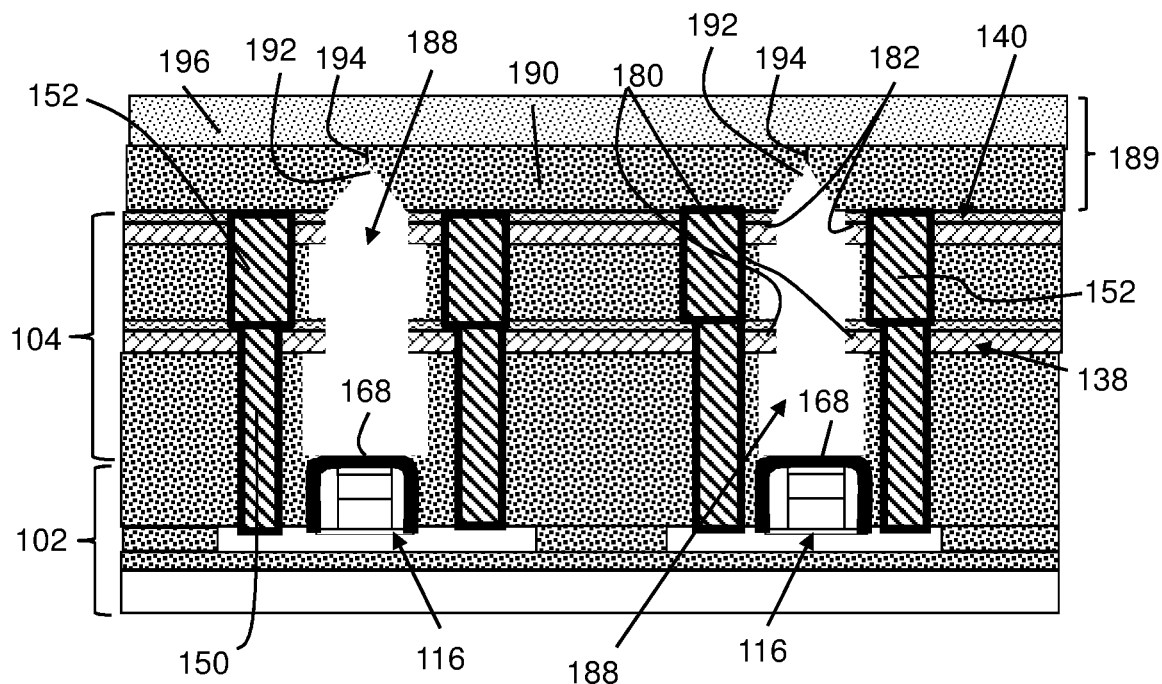
Figure 9A:
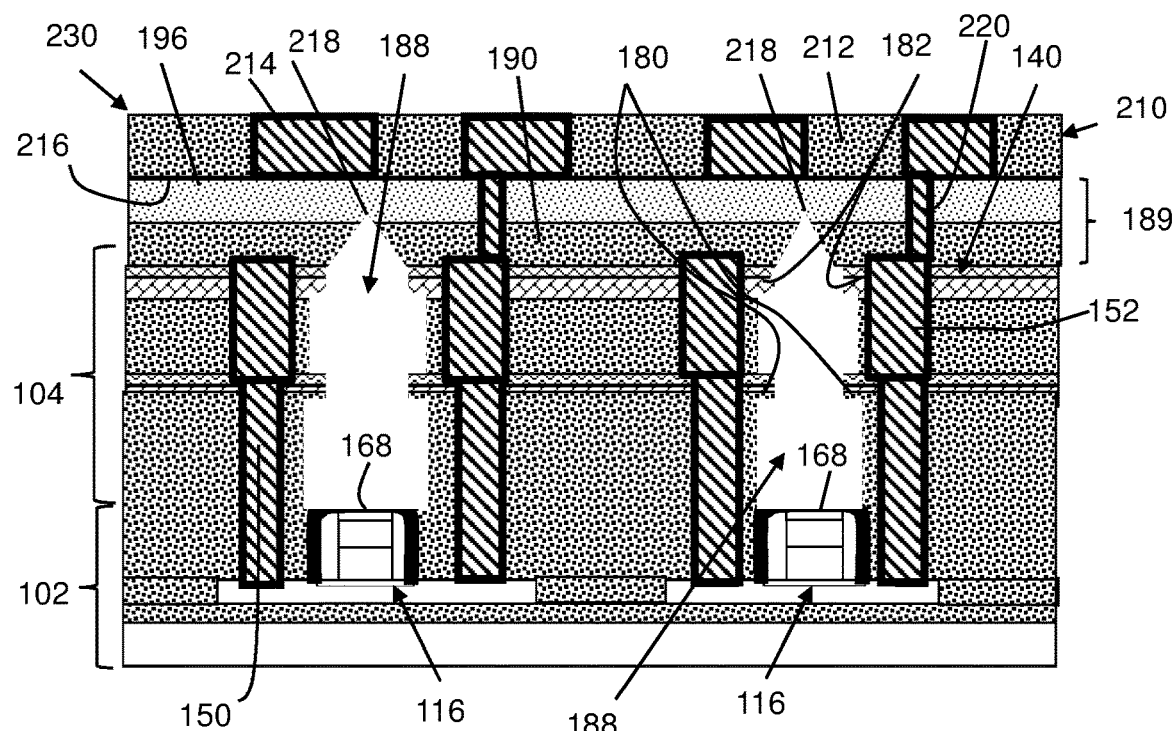
FIGS. 9A and 9B show cross-sectional views of forming a wiring layer and the resulting structures according to embodiments of the disclosure.
Figure 9B:
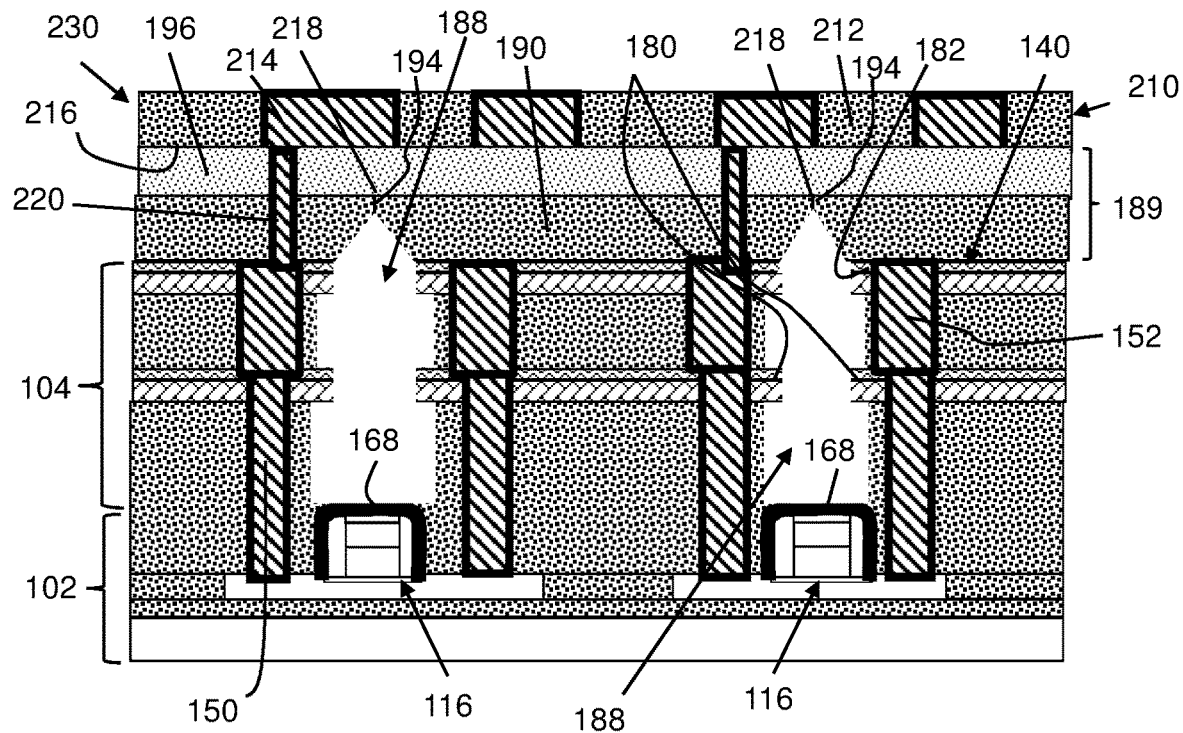

At this stage, opening 166 may be closed to form air gap structure 188 (see e.g., FIGS. 7B and 8B). Alternatively, FIG. 5 shows a cross-sectional view of an optional recessing of exposed sidewalls 170 of ILD 134, 136 of dielectric layer 104 in opening 166. Among other benefits, recessing sidewalls 170 acts to enlarge opening 166 and thus air gaps 188 (FIGS. 7B and 8B), reducing the effective dielectric constant of dielectric layer 104 while leaving the air gap top opening to be sealed in the next process step narrower than the air gap itself. If silicon dioxide films are used for local interconnect layers 130 and first metal layers 132 and silicon nitride is used for cap layer(s) 138, 140, then a hydrofluoric acid (HF) wet etch could be used for this recess (indicated by arrows in FIG. 5 only for brevity). HF concentrations could be in the range of 10:1 to 500:1 dilution with water, as known in the art. Because dielectrics of layers 130 and 132 etch faster than the dielectric of cap layer(s) 138, 140 (FIG. 1), FIG. 6 shows that opening widths BB and CC are wider than air gap top opening AA. The recessing may include, for example, a wet etch as described elsewhere herein. In one embodiment, shown in FIGS. 5 and 6, recessing exposed sidewalls 170 of ILD 134, 136 of dielectric layer 104 in opening 166 may expose an edge 180, 182 of at least one of local interconnect cap layer 138 and first metal cap layer 140 in opening 166.

As will be described, edges 182 assist in closing opening 166 to form an air gap, e.g., by facilitating the pinching off of opening 166. Recessing at this stage can also be used to further deepen opening 166. For example, where opening 166 did not extend through ILD 134 to meet or contact etch stop layer 126, recessing may extend opening 166 thereto. Similarly, recessing could extend opening 166 to, see FIG. 2, recess etch stop layer 126, or expose silicide 125, or expose body 120. Further, recessing could extend opening 166 further into ILD 134 but not expose any of gate 118. In this fashion, the extent to which transistor gate 118 is exposed to an air gap structure 188 (see e.g., FIGS. 9A-B) formed from opening 166 can be precisely controlled in addition to the control provided by the etching of FIG. 3. A space (A-A in FIG. 6) between edges 182 may have a width of, for example, 160 to 200 nm, that can be controlled to assist in closing opening 166. However, as will be described, use of dual dielectric layer 189 (FIGS. 8A-B) to close opening 166 reduces the criticality of the width between edges 182.

FIGS. 7A-8B show cross-sectional views of forming an air gap structure 188 over transistor gate 118 using a dual dielectric layer capping layer 189 (see e.g., FIGS. 8A-B), according to embodiments of the disclosure.

FIGS. 7A and 7B show forming a non-conformal dielectric layer 190 over opening 166. FIG. 7A shows forming non-conformal dielectric layer 190 to stop before sealing opening 166 to leave an end portion 192 of opening 166 open. FIG. 7B shows forming non-conformal dielectric layer 190 to close end portion 192 of opening 166. In one embodiment, non-conformal dielectric layer 190 may include a silane-based silicon dioxide. For example, non-conformal dielectric layer 190 may include chemical vapor deposited (CVD) silane-based silicon dioxide. More particularly, non-conformal dielectric layer 190 may include a plasma-enhanced chemical vapor deposition (PECVD) silane-based silicon dioxide. Other non-conformal dielectrics may also be employed. PECVD silane-based silicon dioxide and non-conformal dielectric material may be chosen because they have very poor step coverage, resulting in a larger air gap volume. Consequently, opening 166 may be devoid of the non-conformal dielectric layer 190 therein, e.g., on sidewalls 170 of dielectric layer 104—ILDs 134, 136, or a trace amounts of layer 190 (not shown) may line sidewalls 170. As shown in FIG. 7B, where non-conformal dielectric layer 190 closes end portion 192 of opening 166, a seam 194 may be created in non-conformal dielectric layer 190 over end portion 192 of opening 166. As noted, use of a non-conformal silane-based silicon dioxide results in a weakness in the form of seam 194 above air gap structure 188. In contrast to conventional processing, non-conformal dielectric layer 190 formation is stopped prior to seam 194 being very large. In one example, seam 194 may have a length between 100 and 160 nanometers (nm), nominally 130 nm, which is significantly shorter than conventional seams in such layers when a non-conformal layer is used alone to seal opening 166, e.g., 170-270 nm. As noted, if left as is, seam 194 can be breached by moisture, e.g., from subsequent wet etches, that enters air gap structure 188 and blisters the layers above the seam, causing defects. Non-conformal dielectric layer 190 may have a thickness, for example, between 2100 and 2300 Ångstroms (Å).

As noted, embodiments of the disclosure employ dual dielectric layer 189 (FIGS. 8A-B) to close opening 166. To this end, as shown in FIGS. 8A and 8B, embodiments of the disclosure further include forming a conformal dielectric layer 196 over non-conformal dielectric layer 190. As shown in FIG. 8A, where non-conformal dielectric layer 190 does not close end portion 192 of opening 166, i.e., end portion 192 remains open, conformal dielectric layer 196 is formed to seal end portion 192 of opening 166 to form air gap structure 188. In contrast, as shown in FIG. 8B, where non-conformal dielectric layer 190 closes end portion 192 of opening 166 and seam 194 is created in non-conformal dielectric layer 190, conformal dielectric layer 196 seals seam 194 in non-conformal dielectric layer 190 to form air gap structure 188. Conformal dielectric layer 196 may be formed by depositing, for example, one of: tetraethyl orthosilicate (TEOS) based silicon dioxide and fluorinated TEOS (FTEOS) based silicon dioxide, e.g., a PECVD TEOS-based silicon dioxide. As such, conformal dielectric layer 196 includes carbon (C), while non-conformal dielectric layer 190 does not include carbon. Other conformal dielectrics may also be employed. It is noted that non-conformal dielectric layer 190 is devoid of wiring. Although conformal dielectric layer 196 is not shown to include a metal or wiring layer, it may more generally contain a lowermost part of wires 214. Conformal dielectric layer 196 may have a thickness between 2100 and 2300 Å, which provides dual dielectric layer 189 (FIGS. 8A-B) with a thickness of 4200 to 4600 Å.

As observed in FIGS. 7B and 8A, edges 182 of first metal cap layer 140 (FIG. 1) of first metal layer 132 may act to pinch opening 166 to assist in closing air gap structure 188. However, use of dual dielectric layer 189 (FIGS. 8A-B) to close off opening 166 reduces the criticality of the width of the opening. Air gap structure 188 does not expose any contact 150 or metal wire 152. That is, ILDs 134, 136 of dielectric layer 104 about air gap structure 188 cover any conductive wire 152 in first metal layer 132 or any conductive contact 150 in local interconnect layer 130. Air gap structure 188 may have any of the lateral layouts of opening 166, as described.

FIGS. 9A-B show cross-sectional views of forming a wiring layer 210 over air gap structure 188 in the FIGS. 8A and 8B embodiments, respectively. Wiring layer 210 may be formed using any now known or later developed process. For example, wiring layer 210 may be formed by forming a second dielectric layer 212 over dual dielectric layer 189, and patterning wiring openings therein, depositing a liner and conductor, and planarizing to create wires 214. Second dielectric layer 212 may include any ILD material listed herein for ILDs 134, 136. As illustrated, a lower surface 216 of wiring layer 210 (e.g., lower surface of second dielectric layer 212 or wire(s) 214 therein) is distanced from a sealing point 218 (e.g., at end portion 192 or above seam 194) of air gap structure 188 by at least a portion of conformal dielectric layer 196. Prior to or with forming of wiring layer 210, any desired contacts 220 may be formed through dual dielectric layer 189, e.g., by forming openings therefor, depositing a liner and conductor, and planarizing to create contacts 220. The materials for contacts 220 and/or wiring 214 may be as described for contacts 150 and wiring 152, herein. Wires 214 and contacts 220 may also be patterned separately but metallized and planarized simultaneously, in which case wires 214 may extend into conformal dielectric layer 196.

FIGS. 9A and 9B also show a structure 230 according to embodiments of the disclosure. Referring to FIG. 9A, structure 230 may include air gap structure 188 including opening 166 in dielectric layer 104 between adjacent conductors, e.g., contacts 150 and/or wires 152. Non-conformal dielectric layer 190 is over opening 166, and narrows end portion 192 of opening 166 but does not seal the opening. Edges 182 may assist in closing opening 166 to form an air gap, e.g., by facilitating the pinching off of opening 166. Non-conformal dielectric layer 190 may include, for example, a silane-based silicon dioxide. Opening 166 may be devoid of the non-conformal dielectric layer 190 therein, e.g., on sidewalls 170 of dielectric layer 104, ILDs 134, 136, or traces of layer 190 (not shown) may be on sidewalls 170. Structure 230 may also include conformal dielectric layer 196 over non-conformal dielectric layer 190. In this embodiment, conformal dielectric layer 196 seals end portion 192 of opening 166. Conformal dielectric layer 196 may include, for example: TEOS based silicon dioxide or FTEOS based silicon dioxide. Consequently, conformal dielectric layer 196 includes carbon (C). Other conformal dielectrics may also be used. Non-conformal dielectric layer 190 may have a thickness between 2100 and 2300 Å, and conformal dielectric layer 196 may have a thickness between 2100 and 2300 Å. Structure 230 may also include wiring layer 210 over air gap structure 188. Wiring layer 210 may include second dielectric layer 212 including wire(s) 214 therein. Structure 230 also has lower surface 216 of wiring layer 210 distanced from sealing point 218 of air gap structure 188 by at least a portion of conformal dielectric layer 196.

FIG. 9B shows a cross-sectional view of another embodiment of structure 230 similar to that of FIG. 9A except non-conformal dielectric layer 190 includes seam 194 is therein over end portion 192 of opening 166. Here, non-conformal dielectric layer 190 closes end portion 192 of opening 166, creating seam 194. Seam 194 may have a length between 100 and 160 nm. Conformal dielectric layer 196 is over non-conformal dielectric layer 190, and seals seam 194 in non-conformal dielectric layer 190. Conformal dielectric layer 196 is devoid of wiring, e.g., wiring 214 in wiring layer 210. Rather, wiring layer 210 is over air gap structure 188, including dual dielectric layer 189 that closes opening 166. Wiring layer 210 may include second dielectric layer 212 including wiring 214 therein.

As will be recognized, structure 230 can be used to form a variety of devices such as but not limited to: a RFSOI switch, a low amplitude amplifier, a power amplifier, etc. Use of air gap structure 188 according to the various embodiments of the disclosure provides a mechanism to reduce off-capacitance and on-resistance of any device using it by controlling one of the main contributors of intrinsic FET capacitance: the effective dielectric constant of local interconnect layer 130 and first metal layer 132 (FIG. 1). Dual dielectric layer 189 ensures improved closure of opening 166. Embodiments of the disclosure use fewer process steps compared to conventional solutions that use spacers to ensure closure of any seam. Further, the processing described reduces air gap structure 188 opening 166 width sensitivity. Embodiments of the disclosure also allow common contact 150 height on airgap and non-airgap structure processing because there is no need to use a thicker dielectric or increase a height of the contacts in different parts of the chip.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:
1. A structure, comprising:
an air gap structure including:
an opening in a first dielectric layer between adjacent conductors,
a non-conformal dielectric layer over the opening, the non-conformal dielectric layer closing an end portion of the opening,
a seam in the non-conformal dielectric layer over the end portion of the opening, and
a conformal dielectric layer over the non-conformal dielectric layer, the conformal dielectric layer struc- tured to seal the seam in the non-conformal dielectric layer and being devoid of wiring; and a wiring layer over the air gap structure.

2. The structure of claim 1, wherein the non-conformal dielectric layer includes a silane-based silicon dioxide.

3. The structure of claim 1, wherein the conformal dielectric layer includes one of: tetraethyl orthosilicate (TEOS) based silicon dioxide and fluorinated TEOS (FTEOS) based silicon dioxide.

4. The structure of claim 1, wherein the seam has a length between 100 and 160 nanometers.

5. The structure of claim 1, wherein the conformal dielectric layer includes carbon (C).

6. The structure of claim 1, wherein the opening of the air gap structure is devoid of the non-conformal dielectric layer therein.

7. The structure of claim 1, wherein the non-conformal dielectric layer has a thickness between 2100 and 2300 Ångstroms, and the conformal dielectric layer has a thickness between 2100 and 2300 Ångstroms.

8. The structure of claim 1, wherein a lower surface of the wiring layer is distanced from a sealing point of the air gap structure by at least a portion of the conformal dielectric layer.

9. A structure, comprising:
an air gap structure including:
an opening in a first dielectric layer between adjacent conductors,
a non-conformal dielectric layer over the opening, the non-conformal dielectric layer narrowing an end portion of the opening but not sealing the opening, and
a conformal dielectric layer on the non-conformal dielectric layer, the conformal dielectric layer structured to seal the end portion of the opening; and
a wiring layer over the air gap structure.

10. The structure of claim 9, wherein the non-conformal dielectric layer includes a silane-based silicon dioxide.

11. The structure of claim 9, wherein the conformal dielectric layer includes one of: tetraethyl orthosilicate (TEOS) based silicon dioxide and fluorinated TEOS (FTEOS) based silicon dioxide.

12. The structure of claim 9, wherein the conformal dielectric layer includes carbon (C).

13. The structure of claim 9, wherein the opening of the air gap structure is devoid of the non-conformal dielectric layer therein.

14. The structure of claim 9, wherein the non-conformal dielectric layer has a thickness between 2100 and 2300 Ångstroms, and the conformal dielectric layer has a thickness between 2100 and 2300 Ångstroms.

15. The structure of claim 9, wherein a lower surface of the wiring layer is distanced from a sealing point of the air gap structure by at least a portion of the conformal dielectric layer.

* * * * *